(12) United States Patent
Kubota

(10) Patent No.: US 6,496,070 B2
(45) Date of Patent: Dec. 17, 2002

(54) BUFFER CIRCUIT COMPRISING LOAD, FOLLOWER TRANSISTOR AND CURRENT SOURCE CONNECTED IN SERIES

(75) Inventor: Miki Kubota, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/871,641

(22) Filed: Jun. 4, 2001

(65) Prior Publication Data

US 2001/0052819 A1 Dec. 20, 2001

(30) Foreign Application Priority Data

Jun. 12, 2000 (JP) .......................................... 2000-174749

(51) Int. Cl.[7] ................................................. H03F 3/16
(52) U.S. Cl. ........................................ 330/277; 330/296
(58) Field of Search ................................ 330/277, 253, 330/261, 286, 290, 296

(56) References Cited

U.S. PATENT DOCUMENTS 5,155,449 A * 10/1992 Ito ............................... 330/277
5,319,318 A * 6/1994 Kunihisa et al. ............. 330/277
6,124,740 A * 9/2000 Klemmer ..................... 330/277

* cited by examiner

Primary Examiner—Tuan T. Lam
(74) Attorney, Agent, or Firm—Staas & Halsey LLP

(57) ABSTRACT

An input buffer circuit 11X is a source follower circuit and comprises a load 114 and enhancement FETs 111 and 112A connected in series between power supply lines VDD and VSS. A DC bias VB1 is applied to the gate of the FET 112A to act it as a current source, and an AC current component of the drain potential VD of the FET 111 is provided through a capacitor 113 to the gate of the FET 112A. If an inductor as an matching circuit is connected in series to the capacitor 113, a band pass filter is constructed, and the gain of the circuit 11X becomes especially high at the resonance frequency thereof. At high frequencies, the interconnection coupled to the capacitor 113 has a parasitic inductance, and the output waveform of the circuit 11X has a high frequency noise. In this case, a damping transistor is connected between the capacitor 113 and the gate of the FET 112A to obtain a flat gain by adjusting the gate potential thereof.

13 Claims, 14 Drawing Sheets

BUFFER CIRCUIT COMPRISING LOAD, FOLLOWER TRANSISTOR AND CURRENT SOURCE CONNECTED IN SERIES

BACKGROUND OF THE INVENTION

1. Field of the Invention

The present invention relates to a buffer circuit comprising a load, a follower transistor such as a source or emitter follower transistor, and a current source connected in series, the follower transistor providing an output potential signal from a source or emitter thereof, the output potential signal following a potential at the control input of the transistor.

2. Description of the Related Art

In optical communication, a high speed communication system exceeding 10 Gbps has been researched and developed in order to realize a large-capacity, long-distance communication, and improvement on wide band frequency characteristics, that is, to achieve a higher cut-off frequency is required for an optical transmission module of the communication system. Hence, a necessity has arisen to improve a frequency characteristic of an amplifying circuit in the optical transmission module. Further, power consumption of the amplifying circuit is a great part of that of an optical transmission module, and it can be expected that reduction in the power consumption of the amplifying circuit not only increases a transmission quality but also contributes to higher reliability of the entire optical transmission module.

FIG. 13 shows a prior art differential amplifier for use in an optical transmission module.

The differential amplifier has a symmetric configuration with respect to complementary inputs IN and IN*.

In a level shift circuit 10A, to obtain an input potential VI, the potential of an input signal IN provided to the gate of an enhancement FET (E-FET) 101 is lowered by a threshold voltage Vth between the gate and source thereof, and further lowered by a forward voltage Vf across a diode 102. For example, Vth=0.3 V and Vf=0.6 V.

In an input buffer circuit 11A, which is a source follower circuit, an E-FET 111 and a depletion FET (D-FET) 112 serving as a current source are connected in series between power supply lines VDD and VSS. The input potential VI is provided to the gate of the E-FET 111, and an output potential VO obtained by lowering the input potential VI by the threshold voltage Vth thereof is taken out from the source of the E-FET 111.

The output potential VO is provided to the gate of the E-FET 121, which is one input of a differential amplifier circuit 12.

A level shift circuit 10B and an input buffer circuit 11B are of the same configurations as those of the level shift circuit 10A and the input buffer circuit 11A, respectively. An input signal *IN is provided through the level shift circuit 10B and the buffer circuit 11B to the gate of an E-FET 122, which is the other input of the differential amplifier 12, as an output potential *VO.

In the input buffer circuit 11A, a current flows through the E-FET 111 and the D-FET 112 without regard to the level of the input potential VI. If design parameters of the D-FET 112 are determined so as to make the current to a small amount for a purpose of decreasing power consumption, then a time constant CR is increased due to increase in resistive component R, the response speed of the input buffer circuit 11A decreases, with the result that a frequency characteristic of the differential amplifier is deteriorated.

In order to solve this problem, a differential amplifier as shown in FIG. 14 was proposed.

In an input buffer circuit 11C, a DC bias potential which is obtained by dividing a voltage between power supply lines VDD and VSS by resistance R1 and R2 is applied to the gate of an E-FET 112A, while an AC component of the output *VO of an input buffer circuit 11D is provided thereto through a capacitor 113. Thereby, the current flowing through the E-FET 112A becomes variable. For example, when the output potentials VO rises and the output potential *VO falls, the gate potential of the E-FET 112A falls, the internal resistance of the E-FET 112A increases, and the output potential VO rises. Therefore it seems that the frequency characteristic would be improved without making the average consumed electric current of the E-FET 112A increase.

However, since the capacitance value of the capacitor 113 is made to a sufficiently larger than the gate capacitance value of the E-FET 112A, although the synthetic capacitance value of the capacitor 113 and the gate of the E-FET 112A becomes almost equal to the gate capacitance value of the E-FET112A, an input capacitance value of the differential amplifier circuit 12 viewed from the output of the input buffer circuit 11D becomes the sum of the gate capacitance value of the E-FET122 and the capacitance value of the capacitor 113, resulting in that a frequency characteristic of the input buffer circuit 11D is deteriorated. The same applies to the input buffer circuit 11C.

When two differential amplifiers of FIG. 14 are cascaded, since the buffer circuit 11C of the second stage differential amplifier also functions as an output buffer circuit of the first stage differential amplifier, this problem arises in an output buffer circuit.

SUMMARY OF THE INVENTION

Accordingly, it is an object of the present invention to provide a buffer circuit capable of improving a frequency characteristic without increasing a current consumption.

In one aspect of the present invention, there is provided a buffer circuit comprising a load, a follower transistor such as a source or emitter follower transistor, and a current source connected in series, the follower transistor providing an output potential signal from a source or emitter thereof, the output potential signal following a potential at the control input of the transistor. The current source has a control input receiving a DC bias, and has a current flowing therethrough depending on the control input potential thereof. A DC blocking circuit such as a capacitor is connected between the drain or emitter of the follower transistor and the control input of the current source.

With this configuration, when the control input potential of the follower transistor changes, the potential of the source or emitter of the transistor follows to this change with a time delay if the DC blocking circuit is not connected. However, with this connection, the current source operates so as to assist the following-up when this change arises without increasing an average current flowing through the current source. Further, in a state where a succeeding circuit such as an amplifier circuit is connected to the source or emitter of the transistor, since the capacitance viewed from the source or emitter of the transistor does not increase owing to connection of the DC blocking circuit, the response speed of the succeeding circuit is improved.

If a matching circuit such as an inductor is connected to the DC blocking circuit to constitute a band pass filter, the buffer circuit has an especially high gain at a resonance frequency thereof, therefore this configuration is effective in an analog circuit using a signal with a narrow frequency range near the resonance frequency.

Since an interconnection in the DC blocking circuit has a parasitic inductance at high frequencies, a band pass filter is constituted of the parasitic inductance and the DC blocking circuit, and the gain of the buffer circuit becomes especially high at the resonance frequency thereof. Therefore, when the buffer circuit is applied to a digital circuit requiring a wide band operation, high frequency noise has a chance to be included in the output waveform of the buffer circuit. In this case, a damping transistor is connected between the DC blocking circuit and the control input of the current source, and the potential of this control input is adjusted and then fixed so as to make a gain flat, by which high frequency noise can be prevented from being included in the output waveform.

Other aspects, objects, and the advantages of the present invention will become apparent from the following detailed description taken in connection with the accompanying drawings.

DESCRIPTION OF THE PREFERRED EMBODIMENTS

Figure 1:
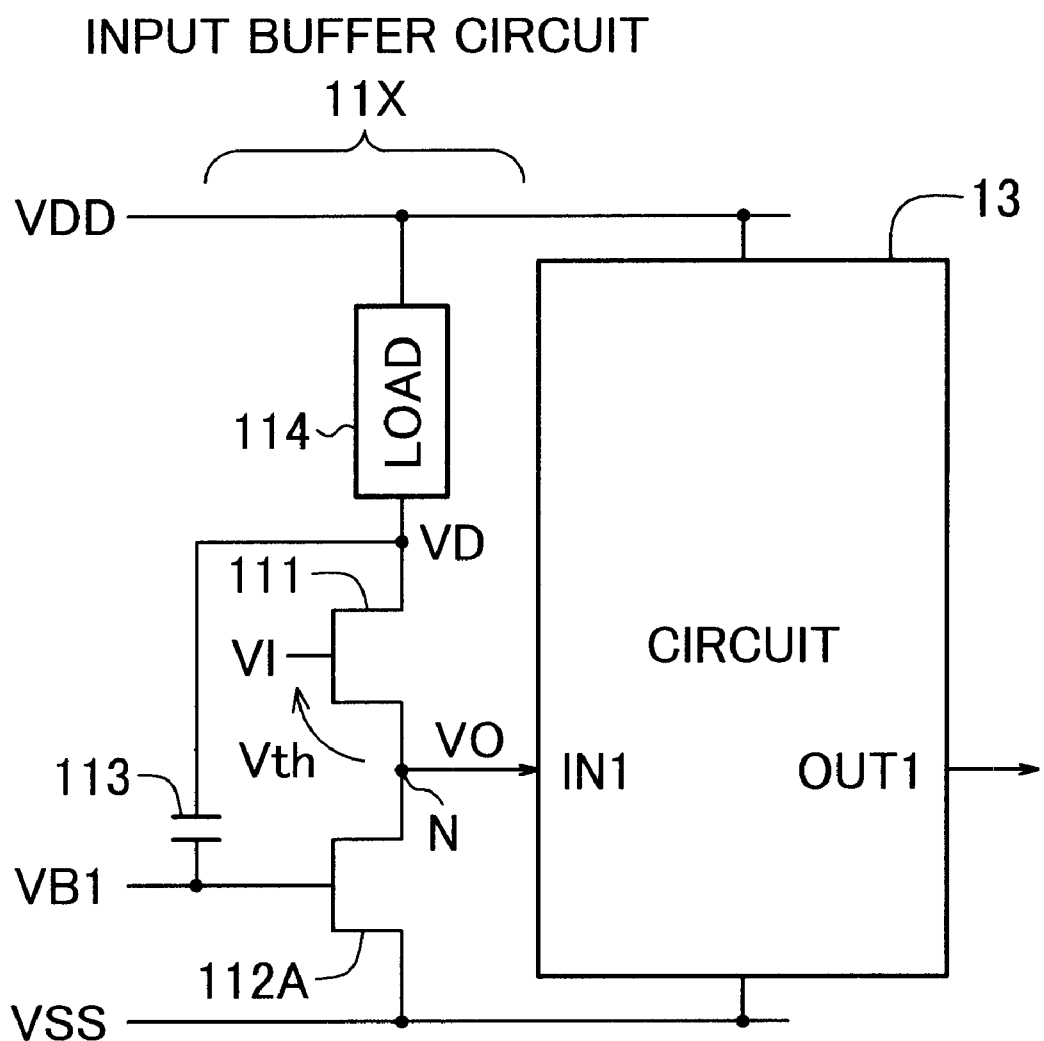
FIG. 1 is a diagram showing a circuit including an input buffer circuit of a first embodiment according to the present invention.

Referring now to the drawings, wherein like reference characters designate like or corresponding parts throughout several views, preferred embodiments of the present invention are described below.

It should be noted that the use of the terms "connected" and "coupled" indicates an electrical connection between two elements and can include an intervening element between the two "coupled" or "connected" elements.

First Embodiment

FIG. 1 shows a circuit including an input buffer circuit 11X of a first embodiment according to the present invention.

The circuit of FIG.1 is formed on a semiconductor chip. The circuit 11X is a source follower circuit. In a case where the input buffer circuit 11X is connected to a preceding stage circuit, the circuit 11X also functions as an output buffer circuit in relation to the preceding stage circuit.

In the input buffer circuit 11X, a load 114, an E-FET 111 and an E-FET 112A are connected in series between a power source lines VDD and VSS.

The load 114 is, for example, a resistance or a load FET and operates such that as a current flowing through the load 114 increases, a voltage between ends thereof rises and a potential VD at a lower potential side end decreases.

A DC bias potential VB1 is applied to the gate of the E-FET 112A such that the E-FET 112A functions as a current source. A capacitor 113 is connected between the gate of the E-FET 112A and the drain of the E-FET 111 so as to provide an alternating current component of the detected potential VD to the gate of the E-FET 112A. The capacitance of the capacitor 113 is so large in comparison with the gate capacitance of the E-FET 112A that the combined capacitance of the both is almost equal to the gate capacitance of the E-FET 112A.

A connection node N between the source of the E-FET 111 and the drain of the E-FET 112A is connected to an input IN1 of a circuit 13. In a steady state, a threshold voltage Vth between the gate and the source of the E-FET 111 is almost constant of, for example, 0.3 V. The gate and the source of the E-FET 111 are an input VI and an output VO, respectively, of the input buffer circuit 11X.

The circuit 13 is, for example, an amplifying circuit or a logic circuit. The input IN1 is, for example, the gate of FET. An OUT1 indicates an output of the circuit 13.

Next, description will be given of operation of the first embodiment constructed as described above.

Figure 2:
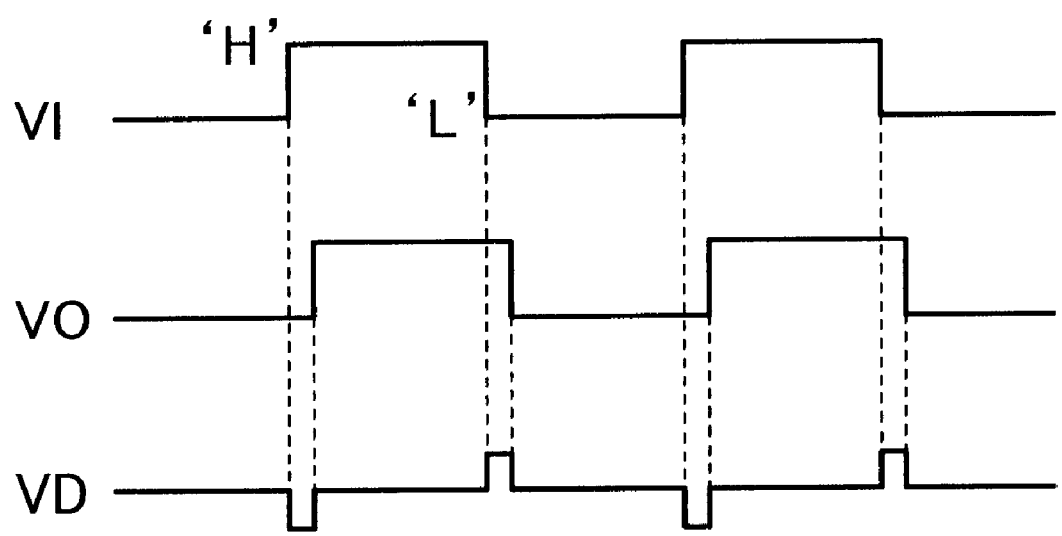
FIG. 2 is a schematic voltage waveform diagram showing operation of the circuit of FIG. 1.

FIG. 2 is a schematic voltage waveform diagram showing operation of the circuit of FIG. 1.

When the input potential VI transits from a low to a high, the output potential VO follows the transition with a small delay thereafter, so the gate to source potential of the E-FET 111 rises in this delay period with decreasing in the internal resistance of the E-FET 111, and thereby the current flowing through the load 114 increases and the detection potential VD decreases. With the decrease in the detection potential VD, a current flows from the gate of the E-FET 112A through the capacitor 113 to the VD, the gate potential of the E-FET 112A decreases, the internal resistance of the E-FET 112A increases, and a current from the node N to the input IN1 flows more easily than to the E-FET 112A.

That is, when the input potential VI transits from a low to a high, the output potential VO follows the transition with a small delay thereafter if the capacitor 113 is not connected, whereas the E-FET 112A operates such that the output potential VO rises even in this delay period if the capacitor 113 is connected.

In a similar manner, when the input potential VI transits from a high to a low, the output potential VO follows the transition with a small delay thereafter if the capacitor is not connected, whereas the E-FET 112A operates such that the output potential VO falls even in this delay period if the capacitor 113 is connected.

In such a manner, when the output potential VO follows a change in the input potential IV, the E-FET 112A operates such that the E-FET 112A assists the following-up if the following-up is delayed. Therefore, the response speed of the input buffer circuit 11X increases without increasing an average current flowing through the E-FET 112A, thereby improving a frequency characteristic of the input buffer circuit 11X. Further, since an input capacitance of the circuit 13 viewed from the output of the input buffer circuit 11X does not increase owing to connection of the capacitor 113, the response speed of the circuit 13 is improved in comparison with using the input buffer circuit 11C of FIG. 14, thereby improving a frequency characteristic of the circuit 13.

Second Embodiment

Figure 3:
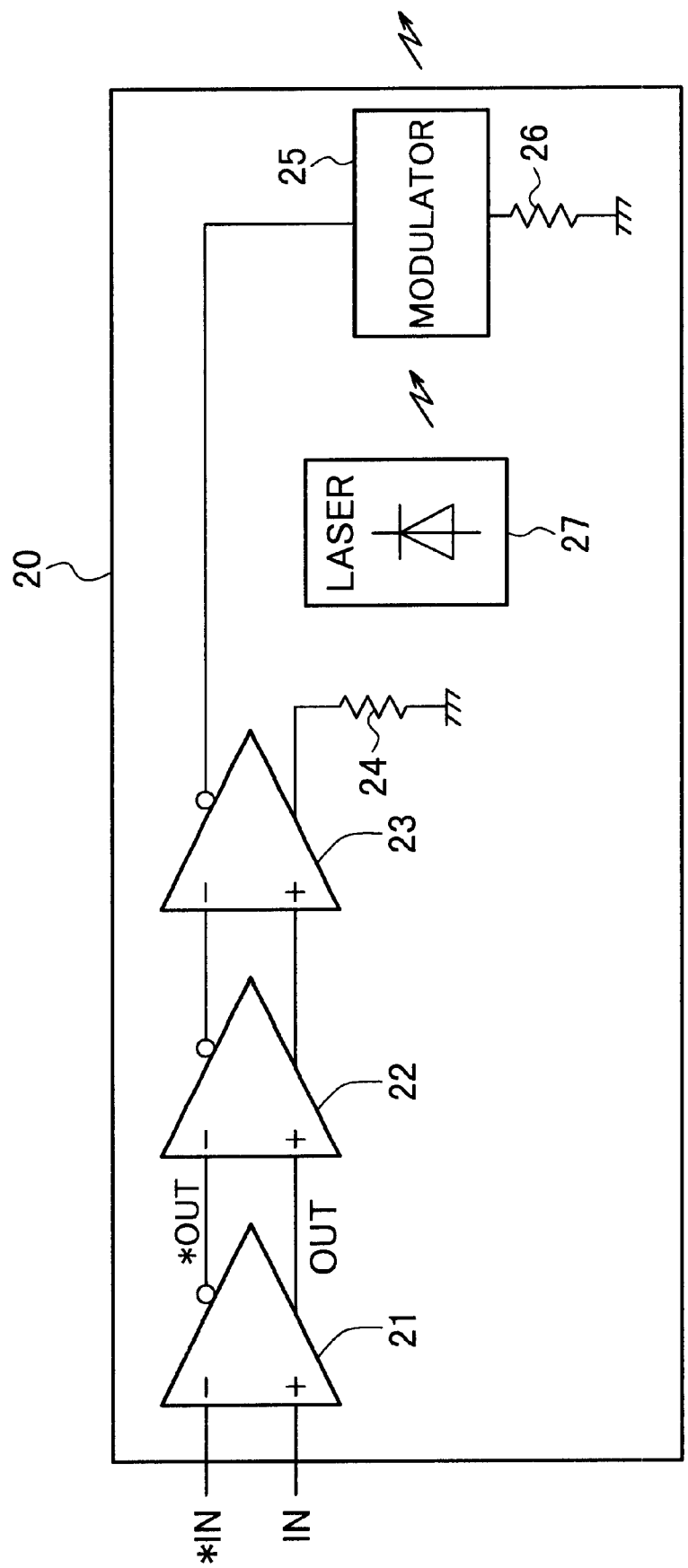
FIG. 3 is a schematic block diagram showing an optical transmission module.

FIG. 3 is a schematic block diagram showing an optical transmission module 20.

In the module 20, differential amplifiers 21, 22 and 23 of the same configuration as each other are connected in cascade. Complementary input signals IN and IN* are provided to non-inversion and inversion inputs, respectively, of the differential amplifier 21. A non-inversion output of the differential amplifier 23 is grounded through a terminating resistance 24 and an inverting output of the differential amplifier 23 is grounded through a modulator 25 and a terminating resistance 26. The modulator 25 is optically coupled to an output of a semiconductor laser 27 so that the optical output of the semiconductor laser 27is modulated in the modulator 25, and the modulated laser beam are provided to an optical fiber not shown.

Figure 4:
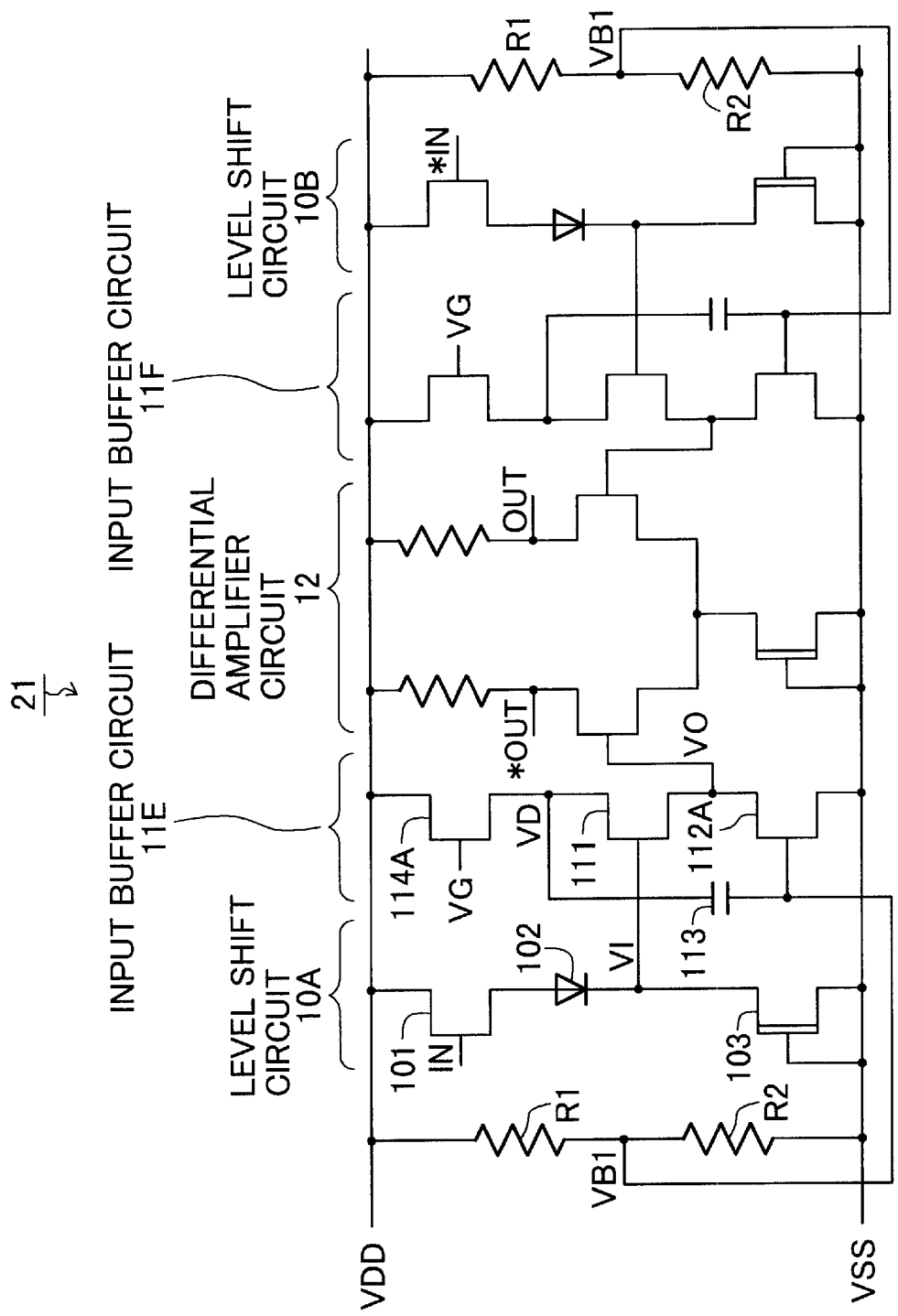
FIG. 4 is a circuit diagram showing a differential amplifier in FIG. 3 as a second embodiment according to the present invention.

FIG. 4 shows an embodiment of the differential amplifier 21 of FIG. 3, as a second embodiment according to the present invention.

Figure 14:
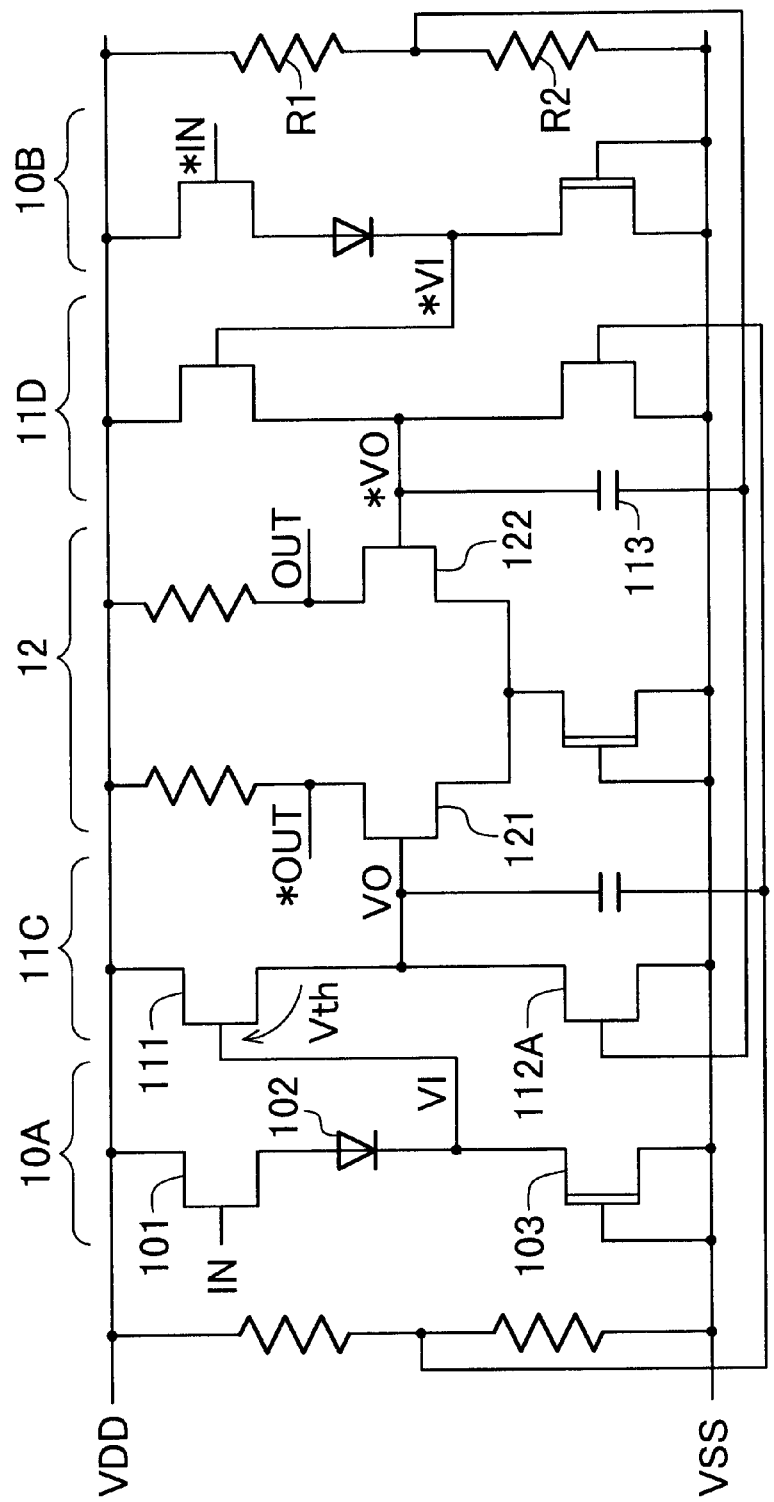
FIG. 14 is a circuit diagram showing another prior art differential amplifier.

The differential amplifier 21 is different from the differential amplifier of FIG. 14 in regard to a pair of input buffer circuits only.

An input buffer circuit 11E is configured such that the load 114 in the input buffer circuit 11X of FIG. 1 is constituted of an E-FET 114A. A DC potential VG is applied to the gate of the E-FET 114A. A DC bias potential VB1 applied to the gate of the E-FET 112A is obtained by dividing a potential difference between power source lines VDD and VSS by resistances R1 and R2.

The differential amplifier 21, like FIG. 14, has a symmetric configuration with respect to inputs IN and IN*, wherein an input buffer circuit 11F has the same configuration as that of the input buffer circuit 11E.

In regard to operation of E-FET 114A, when the input potential VI transits from a low to a high, the internal resistance of the E-FET 111 decreases to increase a current flowing through the E-FET 114A and then increase a difference between the power supply potential VDD and the detection potential VD, thus lowering the detection potential VD. The other operations of the input buffer circuit 11E are the same as those described in the first embodiment, so descriptions thereof are omitted.

Figure 5:
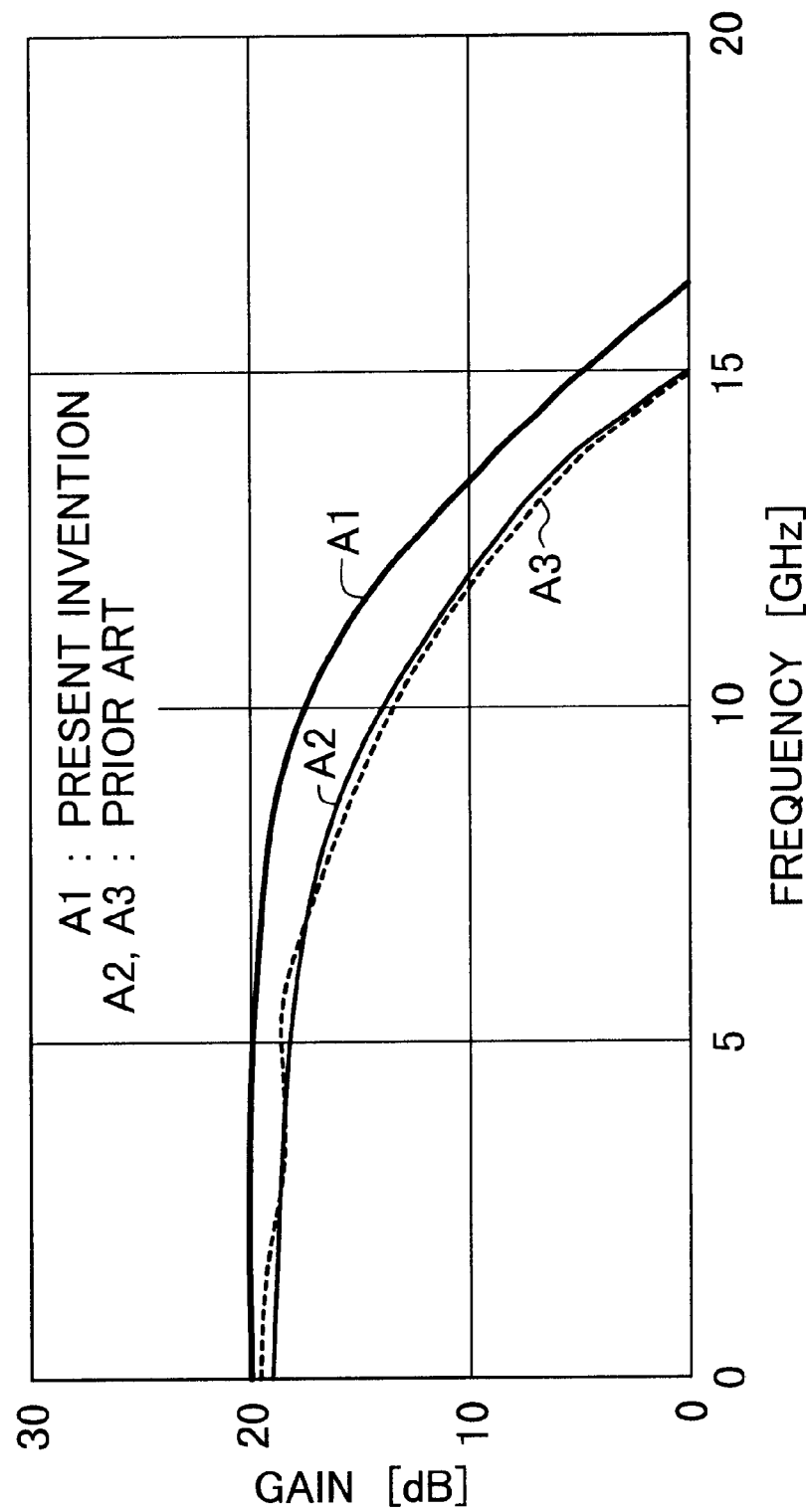
FIG. 5 is a graph showing frequency characteristics obtained by fabricating and performing measurement on the circuits of FIGS. 4, 13 and 14.
Figure 13:
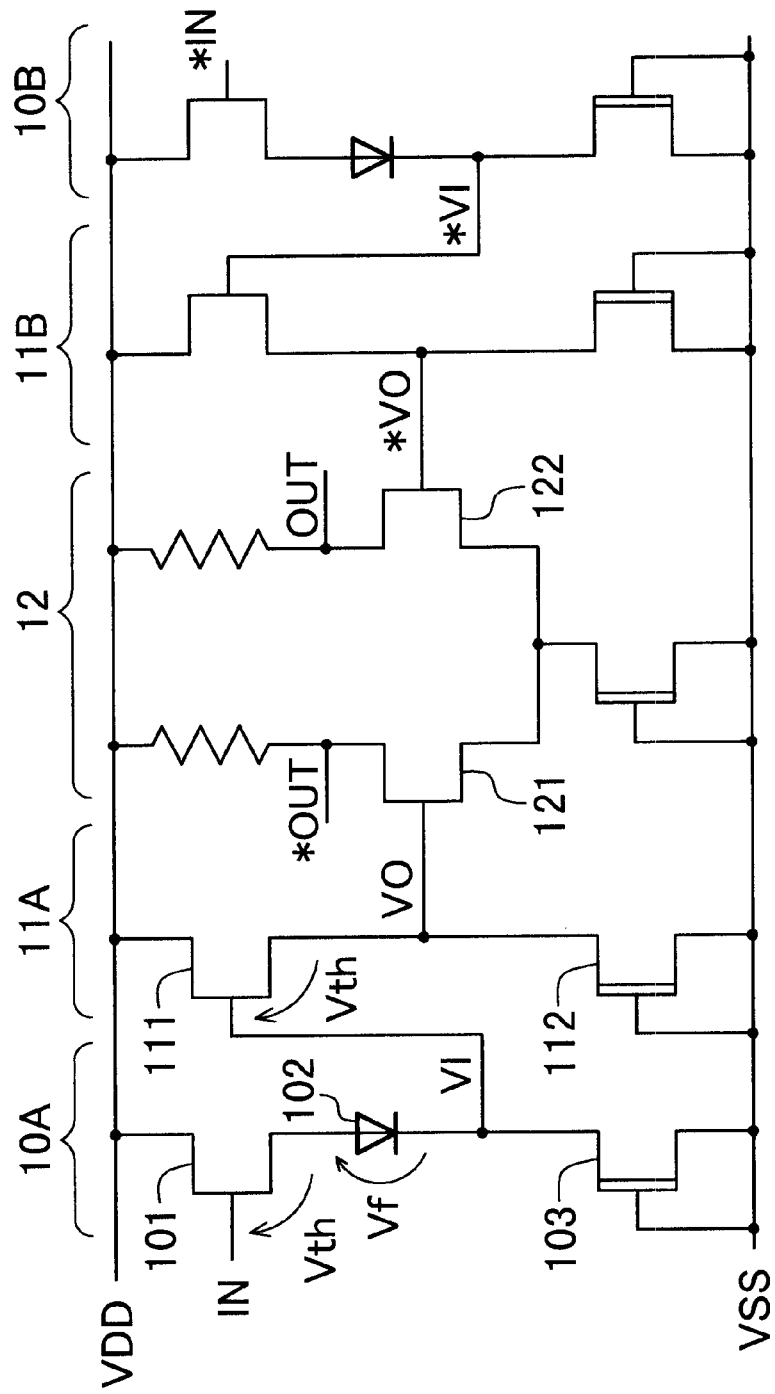
FIG. 13 is a circuit diagram showing a prior art differential amplifier for use in an optical transmission module.

Curves A1 to A3 of FIG. 5 show frequency characteristics obtained by fabricating and performing measurement on the circuits of FIGS. 4, 13 and 14, respectively. In these circuits, respective parameters of corresponding elements were set to the same as each other in order that their effects could be compared with each other, and FETs adopted were GaAs FETs. Although cut-off frequencies of the circuits of FIGS. 13 and 14 are 8 GHz, that of the circuit of FIG. 4 is 10.5 GHz, resulting in improving a frequency characteristic required for wider band.

Third Embodiment

Figure 6:
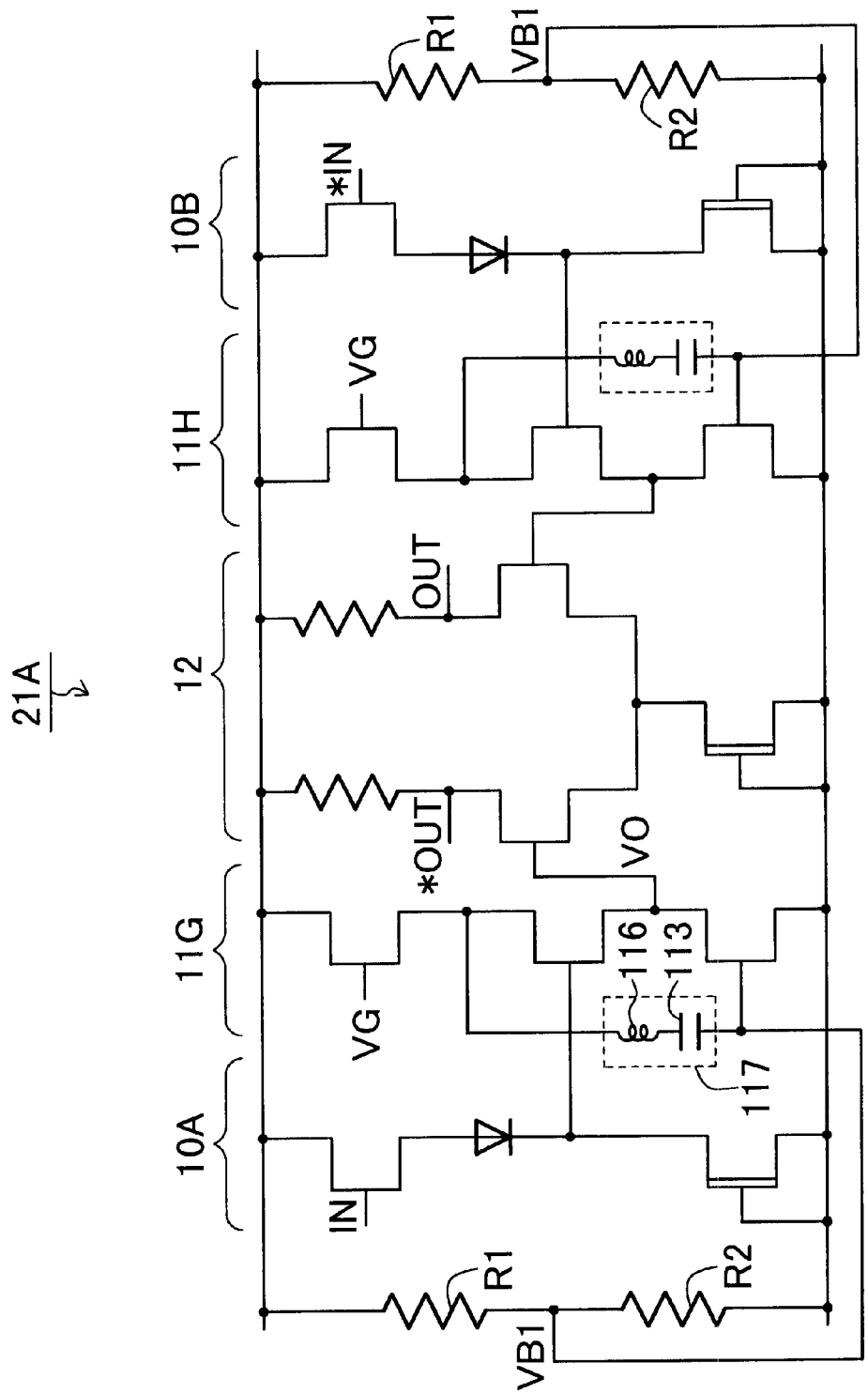
FIG. 6 is a circuit diagram showing a differential amplifier of a third embodiment according to the present invention.

FIG. 6 shows a differential amplifier 21A of a third embodiment according to the present invention.

An input buffer circuit 11G is different from the input buffer circuit 11E of FIG. 4 in that an inductor 116 is connected in series to a capacitor 113. The same applies to an input buffer circuit 11H whose configuration is the same as that of the input buffer circuit 11G.

The capacitor 113 and the inductor 116 constitute a band pass filter 117, and the impedance of the band pass filter 117 becomes the minimum (zero if line resistance is neglected) at a resonance frequency thereof. Therefore, a gain of the differential amplifier 21A is especially high at the resonance frequency. Therefore, the differential amplifier 21A is not useful in a digital circuit as shown in FIG. 3 requiring a frequency characteristic of a flat gain over a wide band, but effective in an analog circuit using a signal with a narrow frequency range near the resonance frequency.

Figure 7:
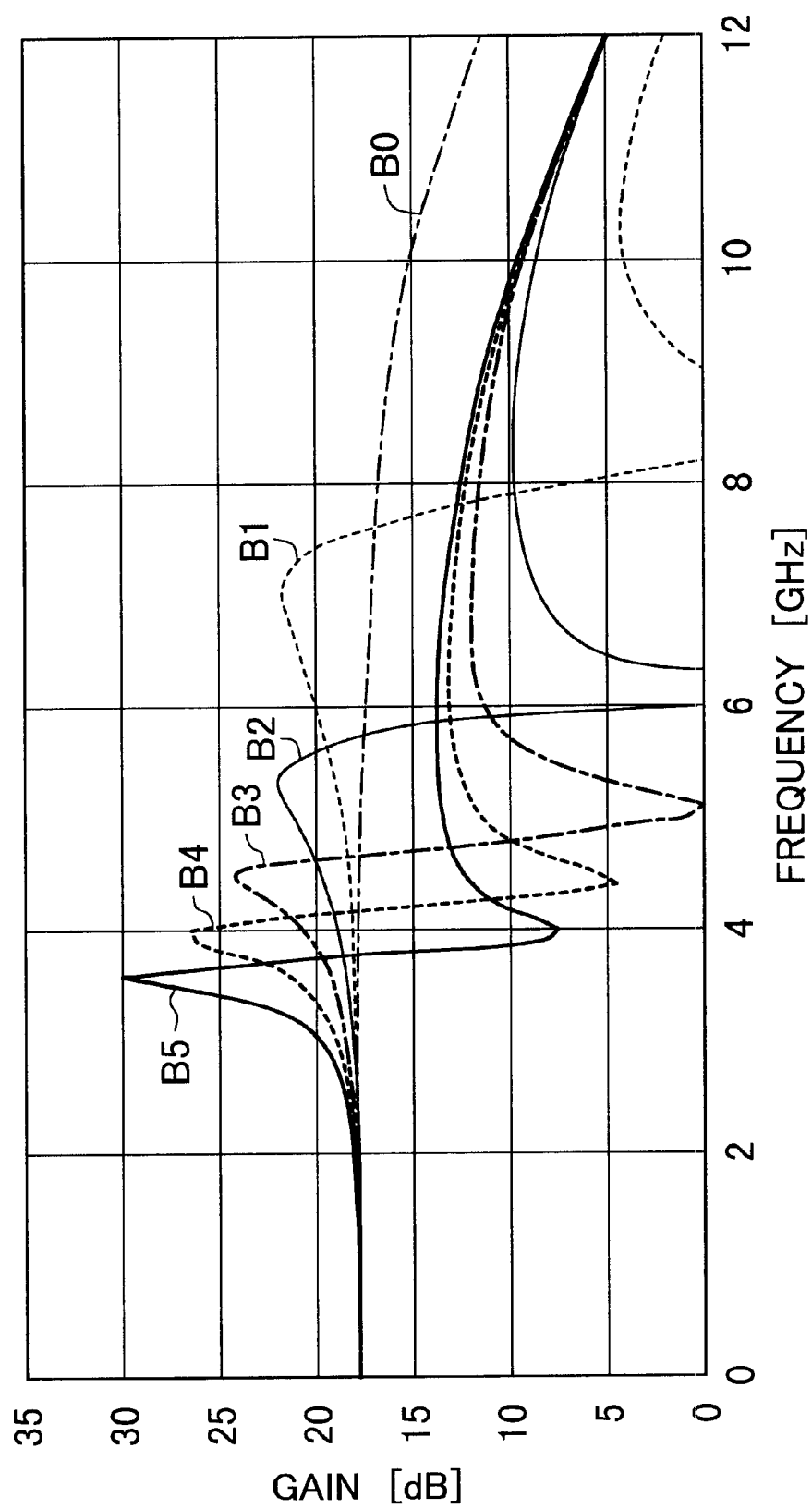
FIG. 7 is a graph showing frequency characteristics obtained by fabricating the differential amplifier of FIG. 6 in which an inductance is variable and performing measurement on the amplifier with each inductance value.

FIG. 7 is a graph showing frequency characteristics obtained by fabricating the differential amplifier 21A in which the inductance of the inductor 116 is variable and performing measurement on the amplifier for each inductance value.

When L0 to L5 denotes the inductances of frequency characteristic curves B0 to B5, respectively, there is a relationship L5>L4>L3>L2>L1 >L0=0.

Fourth Embodiment

Figure 8:
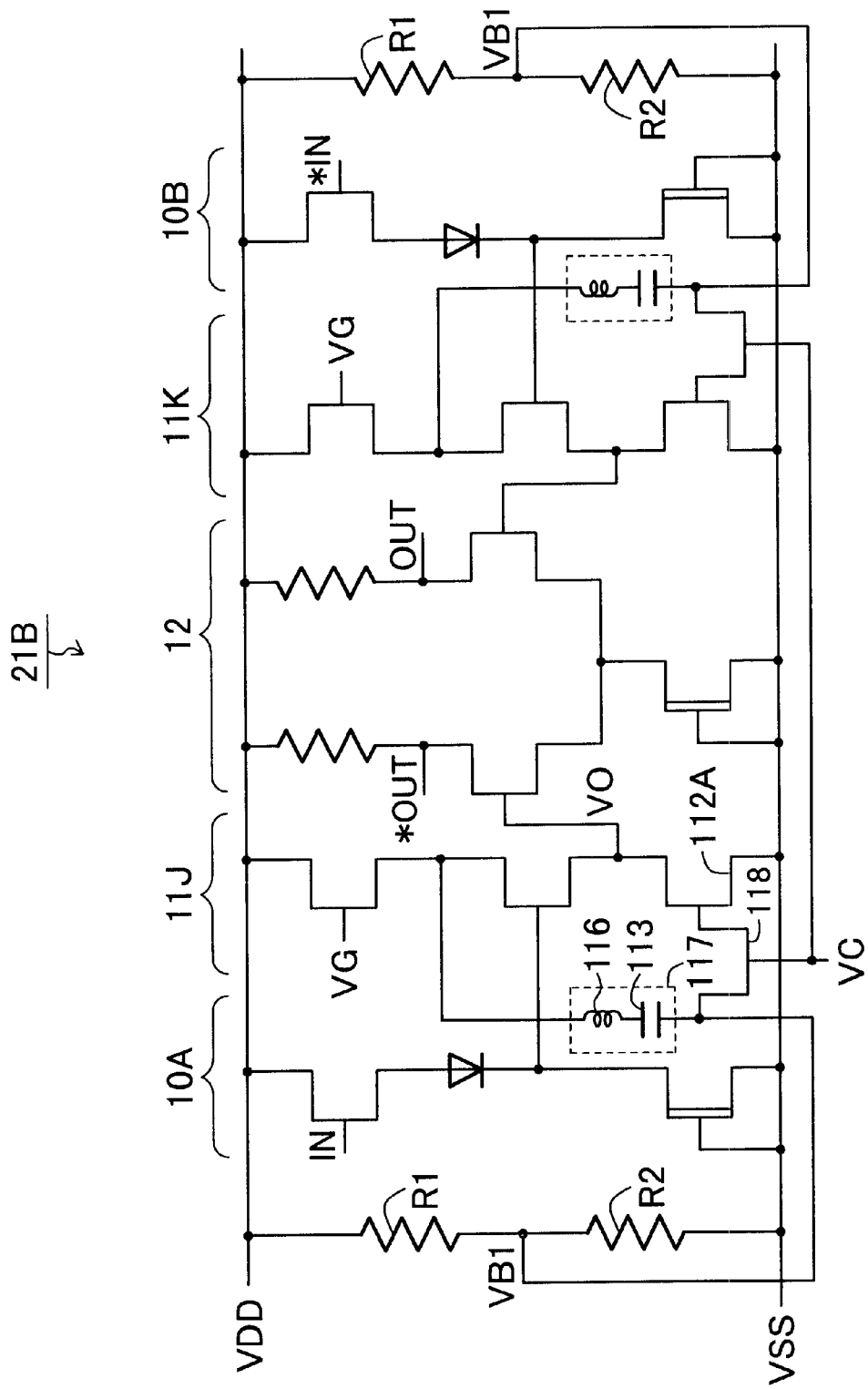
FIG. 8 is a circuit diagram showing a differential amplifier of a fourth embodiment according to the present invention.

FIG. 8 shows a differential amplifier 21B of a fourth embodiment according to the present invention.

An input buffer circuit 11J is different from the input buffer circuit 11G of FIG. 6 in that an E-FET 118 is connected between a band pass filter 117 and the gate of the E-FET 112A. The DC potential VB1 is applied to a connection node between the band pass filter 117 and the E-FET 118. The E-FET 118 functions as a dumping variable resistor and a DC potential VC determining the resistance value thereof may be provided either in a chip on which the differential amplifier 21B is fabricated or from outside the chip.

The same is true of an input buffer circuit 11K which has the same configuration as that of the input buffer circuit 11J.

Figure 9:
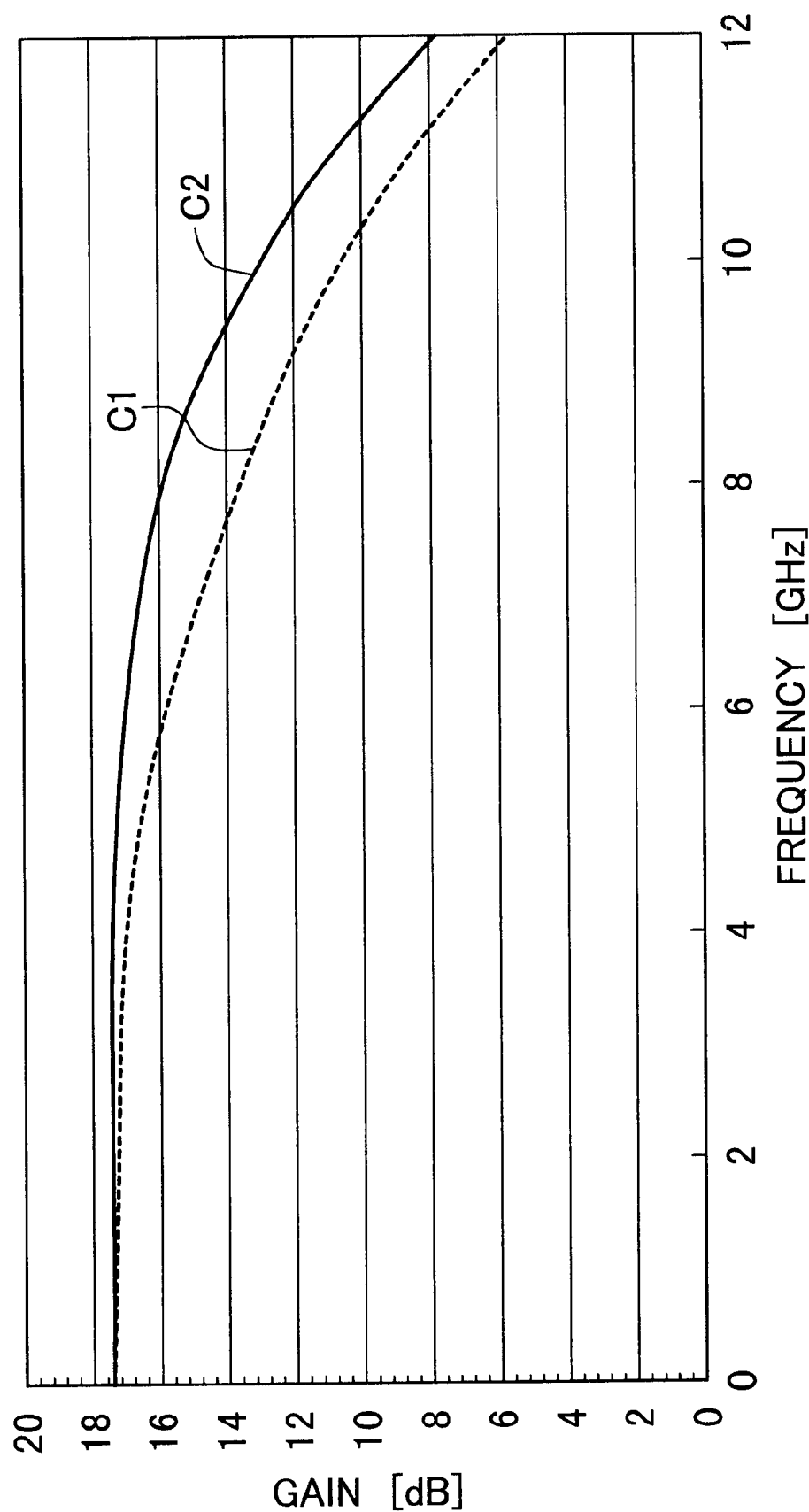
FIG. 9 is a graph showing frequency characteristics of the differential amplifier of FIG. 8 when a transistor 118 is turned off and when the transistor is turned on such that an internal resistance of the transistor has a proper value.

An interconnection has a parasitic inductance in a high frequency operation, which is denoted as 116 in FIG. 8. When the E-FET 118 is off, if a frequency characteristic of the differential amplifier 21B has a curve Cl of FIG. 9 for example, the DC potential VC applied to the gate of the E-FET 118 is adjusted and fixed so that a frequency characteristic of the differential amplifier 21B has a curve C2 of FIG. 9 for example. Thereby, it is possible to increase in gain with preventing a high-frequency noise involved in an output waveform of the differential amplifier 21B.

Fifth Embodiment

Figure 10:
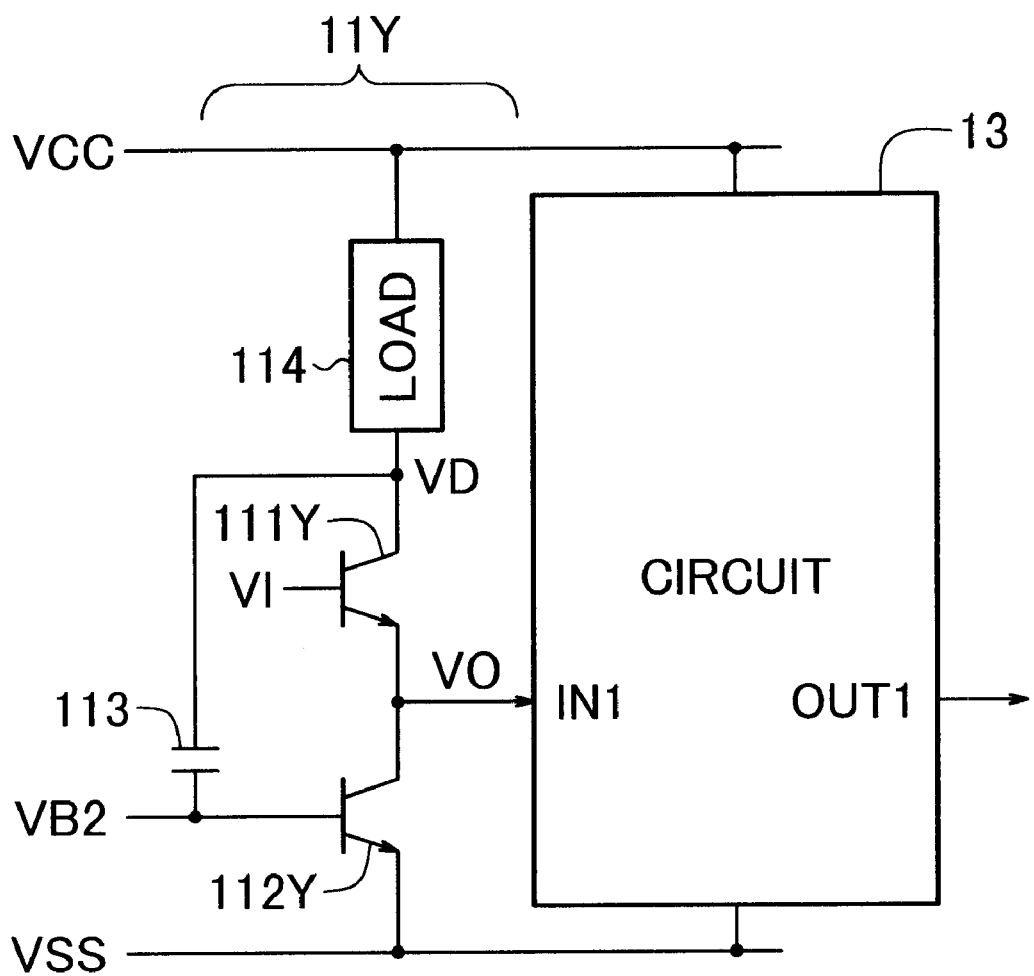
FIG. 10 is a diagram showing a circuit including an input buffer circuit analogous to FIG. 1, of a fifth embodiment according to the present invention.

FIG. 10 shows a circuit including an input buffer circuit 11Y analogous to FIG. 1, of a fifth embodiment according to the present invention.

In the circuit, PNP transistors 111Y and 112Y are employed instead of the E-FET 111 and the E-FET 112A, respectively, of FIG. 1. A DC potential VB2 is applied to the base of the transistor 112Y such that the transistor 112Y functions as a current source. The transistor 111Y functions as an emitter follower.

The other points are the same as those of the first embodiment.

Sixth Embodiment

Figure 11:
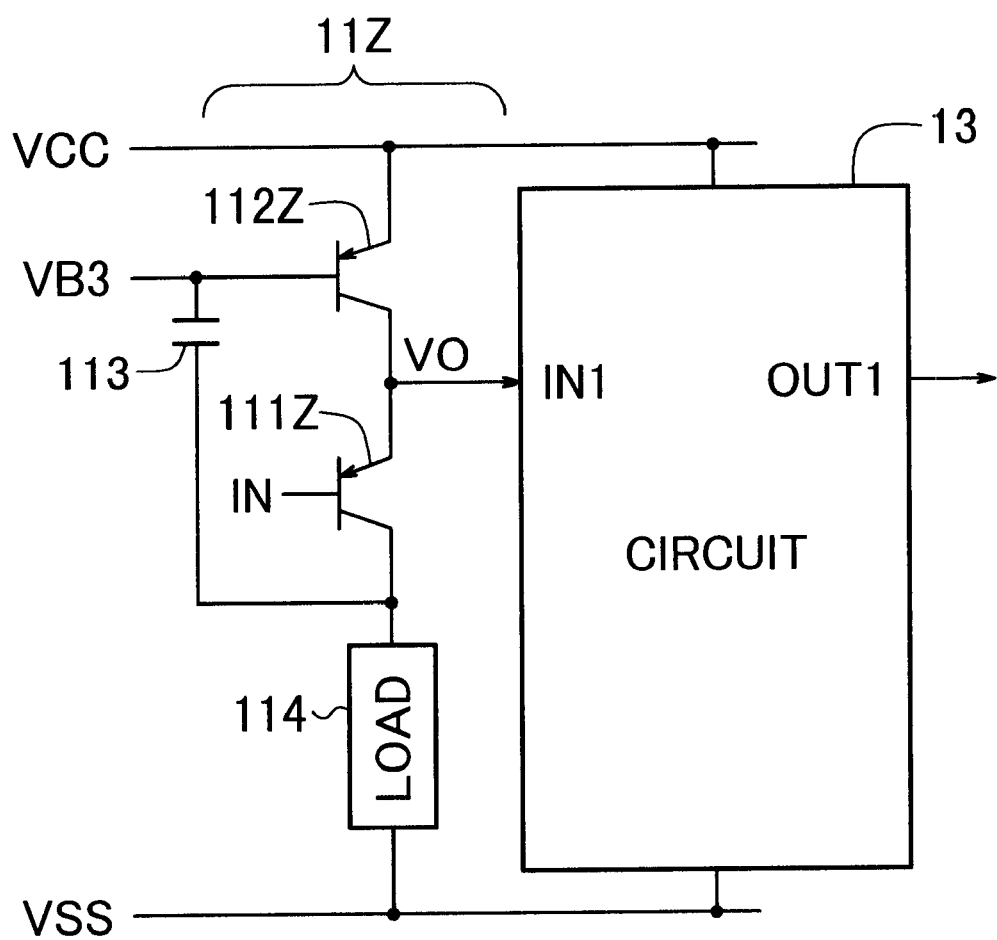
FIG. 11 is a diagram showing a circuit including another input buffer circuit analogous to FIG. 1, of a sixth embodiment according to the present invention.

FIG. 11 shows a circuit including an input buffer circuit 11Z analogous to FIG. 1, of a sixth embodiment according to the present invention.

In the circuit, PNP transistors 111Z and 112Z are employed instead of the NPN transistors 111Y and 112Y, respectively, of FIG. 10. A DC potential VB3 is applied to the base of the transistor 112Z such that the transistor 112Z functions as a current source. The transistor 111Z functions as an emitter follower.

The other points are the same as those of the fifth embodiment.

Seventh Embodiment

Figure 12:
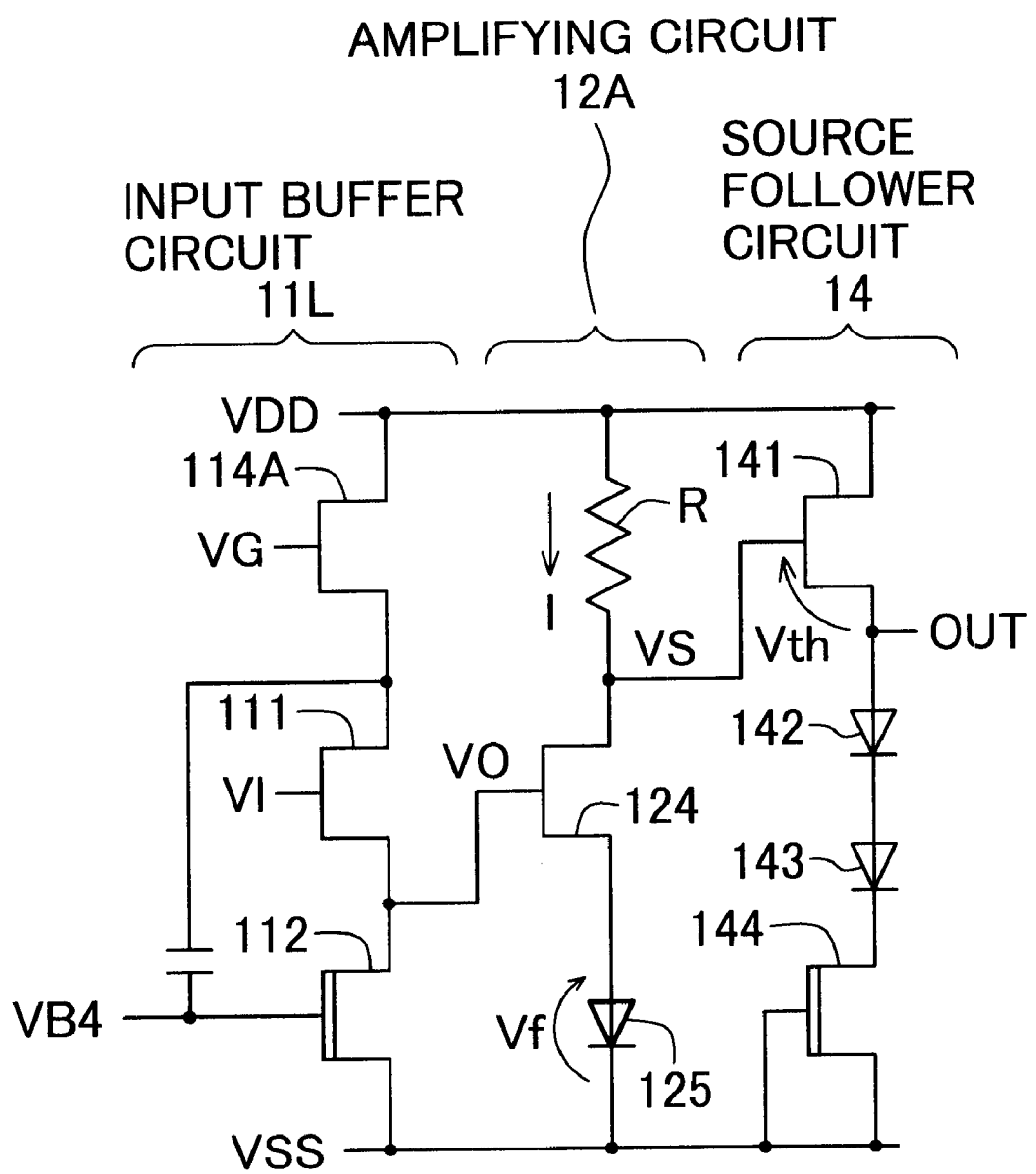
FIG. 12 is a diagram showing a circuit including still another input buffer circuit analogous to FIG. 1, of a seventh embodiment according to the present invention.

FIG. 12 shows a circuit including an input buffer circuit 11L analogous to FIG. 1, of a seventh embodiment according to the present invention.

The input buffer circuit 11L is configured such that in the input buffer circuit 11E of FIG. 4, the E-FET 112 is replaced with a D-FET 112. A DC potential VB4 is applied to the gate of the D-FET 112 such that the D-FET 112 acts as a current source. The potential VB4 is lower than the potential VB1 of FIG. 4.

The input buffer circuit 11L operates like the input buffer circuit 11E of FIG. 4. The output potential VO of the input buffer circuit 11L is provided through an amplifying circuit 12A to a source follower circuit 14 to output a signal OUT.

In the amplifying circuit 12A, a resistance R, an E-FET 124 and a diode 125 are connected in series between the power source lines VDD and VSS. The source potential of the E-FET 124 is equal to a forward voltage Vf of the diode 125, for example, 1.2 V. A current I depending on a potential difference between the output potential VO and the Vf flows through the resistance R, and a potential VS=VDD−I×R is provided from the drain of E-FET 124.

In the source follower circuit 14, an E-FET 141, diodes 142 and 143, and a D-FET 144 are connected in series between the power source lines VDD and VSS. The potential VS is applied to the gate of the E-FET 141 and the potential OUT=VS−Vth is outputted from the source of the E-FET 141.

Although preferred embodiments of the present invention has been described, it is to be understood that the invention is not limited thereto and that various changes and modifications may be made without departing from the spirit and scope of the invention.

For example, each FET employed in the above embodiments may be a HEMT or a MOS. Further, in a buffer circuit, a configuration may be adopted in which a level shift diode is connected in a forward direction between a source follower transistor or an emitter follower transistor and a current source. A diode may be a transistor in which the control input is short-circuited to one end of the current path. Further, a different band pass filter, a low pass filter or a high pass filter may be employed instead of the filter 117 of FIG. 6.

What is claimed is:

1. A buffer circuit comprising a transistor, said transistor having a current path and a control input, said current path having first and second ends, said transistor providing an output potential signal following an input potential signal at said control input from said second end, said buffer circuit further comprising:
    a load element, connected between said first end and a first power supply line;
    a current source, connected between said second end and a second power supply line, having a control input receiving a DC bias, having a current flowing therethrough depending on a potential onto said control input thereof;
    a DC blocking circuit, connected to said first end; and
    a transistor, connected between said DC blocking circuit and said control input of said current source.

2. The buffer circuit of claim 1, wherein said DC blocking circuit comprising a capacitor for blocking a DC current.

3. A buffer circuit comprising a transistor, said transistor having a current path and a control input, said current path having first and second ends, said transistor providing an output potential signal following an input potential signal at said control input from said second end, said buffer circuit further comprising:
    a load element, connected between said first end and a first power supply line;
    a current source, connected between said second end and a second power supply line, having a control input receiving a DC bias, having a current flowing therethrough depending on a potential onto said control input thereof;
    a DC blocking circuit, comprising a capacitor, connected between said first end and said control input of said current source; and
    an inductor connected in series to said capacitor.

4. The buffer circuit of claim 3, further comprising:
    a level shift circuit, shifting an input potential to provide said input potential signal onto said control input of said transistor.

5. The buffer circuit of claim 3, wherein said inductor is a parasitic inductance of an interconnection coupled to said capacitor.

6. The buffer circuit of claim 5, further comprising:
    a damping transistor, connected between said capacitor and said control input of said current source.

7. The buffer circuit of claim 6, wherein said damping transistor has a control input receiving a DC bias potential.

8. An amplifier comprising a buffer circuit comprising:
    a transistor, said transistor having a current path and a control input, said current plan having first and second ends, said transistor providing an output potential signal following an input potential signal at said control input from said second end;
    an amplifying circuit, having a signal input connected to said second end;
    a load element, connected between said first end and a first power supply line;
    a current source, connected between said second end and a second power supply line, having a control input receiving a DC bias, having a current flowing therethrough depending on a potential onto said control input thereof;
    a DC blocking circuit, connected to said first end; and a transistor, connected between said DC blocking circuit and said control input of said current source.

9. An amplifier comprising first and second input buffer circuits, each of said first and second input buffer circuit comprising:

a first transistor, having a current path and a control input, said current path having first and second ends, said first transistor providing an output potential signal following an input potential signal at said control input from said second end;

a load element, connected between said first end and a first power supply line;

a current source, connected between said second end and a second power supply line, having a control input receiving a DC bias, having a current flowing therethrough depending on a potential onto said control input thereof;

a DC blocking circuit, connected to said first end; and a second transistor, connected between said DC blocking circuit and said control input of said current source, wherein said control input of said first transistor of said first buffer circuit is a non-inversion input of said amplifier, and said control input of said first transistor of said second buffer circuit is an inversion input of said amplifier.

10. An optical transmission device comprising: an amplifier amplifying an input signal; a laser modulator receiving an output of said amplifier; and a semiconductor laser whose output light is modulated by said laser modulator, wherein said amplifier comprising a buffer circuit comprising:

a transistor, having a current path and a control input, said current path having first and second ends, said transistor providing and output potential signal following an input potential signal at said control input from said second end;

a load element, connected between said first end and a first power supply line;

a current source, connected between said second end and a second power supply line, having a control input receiving a DC bias, having a current flowing therethrough depending on a potential onto said control input thereof;

a DC blocking circuit, connected to said first end; and a transistor, connected between said DC blocking circuit and said control input of said current source.

11. An amplifier comprising a buffer circuit comprising:

a transistor, said transistor having a current path and a control input, said current path having first and second ends, said transistor providing an output potential signal following an input potential signal at said control input from said second end; and an amplifying circuit, having a signal input connected to said second end;

wherein said buffer circuit further comprising:

a load element, connected between said first end and a first power supply line;

a current source, connected between said second end and a second power supply line, having a control input receiving a DC bias, having a current flowing therethrough depending on a potential onto said control input thereof;

a DC blocking circuit, comprising a capacitor, connected between said first end and said control input of said current source; and an inductor connected in series to said capacitor.

12. An amplifier comprising first and second input buffer circuits, each of said first and second input buffer circuits comprising:

a transistor, having a current path and a control input, said current path having first and second ends, said transistor providing an output potential signal following an input potential signal at said control input from said second end;

a load element, connected between said first end and a first power supply line;

a current source, connected between said second end and a second power supply line, having a control input receiving a DC bias, having a current flowing therethrough depending on a potential onto said control input thereof;

a DC blocking circuit, comprising a capacitor, connected between said first end and said control input of said current source; and an inductor connected in series to said capacitor, wherein said control input of said transistor of said first buffer circuit is a non-inversion input of said amplifier, and said control input of said transistor of said second buffer circuit is an inversion input of said amplifier.

13. An optical transmission device comprising:

an amplifier amplifying an input signal;

a laser modulator receiving an output of said amplifier;

and a semiconductor laser whose output light is modulated by said laser modulator, wherein said amplifier comprising a buffer circuit comprising:

a transistor, having a current path and a control input, said current path having first and second ends, said transistor providing an output potential signal following an input potential signal at said control input from said second end;

a load element, connected between said first end and a first power supply line;

a current source, connected between said second end and a second power supply line, having a control input receiving a DC bias, having a current flowing therethrough depending on a potential onto said control input thereof;

a DC blocking circuit, comprising a capacitor, connected between said first end and said control input of said current source; and an inductor connected in series to said capacitor.

* * * * *